United States Patent
Sun et al.

(10) Patent No.: US 10,886,345 B2
(45) Date of Patent: Jan. 5, 2021

(54) OLED DISPLAY PANEL HAVING A ROUGHENED SURFACE, DISPLAY APPARATUS AND METHOD OF MANUFACTURING OLED DISPLAY PANEL

(71) Applicant: BOE TECHNOLOGY GROUP CO., LTD., Beijing (CN)

(72) Inventors: Tao Sun, Beijing (CN); Lujiang Huangfu, Beijing (CN); Song Zhang, Beijing (CN); Ziyu Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/425,924

(22) Filed: May 29, 2019

(65) Prior Publication Data

US 2020/0091257 A1    Mar. 19, 2020

(30) Foreign Application Priority Data

Sep. 14, 2018 (CN) .................... 2018 2 1518549 U

(51) Int. Cl.
  *H01L 27/32* (2006.01)
  *H01L 51/00* (2006.01)

(52) U.S. Cl.
  CPC ...... *H01L 27/3246* (2013.01); *H01L 51/0097* (2013.01); *H01L 27/3283* (2013.01); *H01L 2227/323* (2013.01); *H01L 2251/5338* (2013.01)

(58) Field of Classification Search
  CPC ............. H01L 27/3246; H01L 27/3283; H01L 27/3295; H01L 51/0097
  See application file for complete search history.

(56) References Cited

U.S. PATENT DOCUMENTS

| | | | | |
|---|---|---|---|---|
| 7,531,834 B2 * | 5/2009 | Lee | ..................... | H01L 27/3246 257/103 |
| 8,933,459 B2 * | 1/2015 | Yoon | ................... | H01L 27/3265 257/72 |
| 9,184,387 B2 * | 11/2015 | Kim | ..................... | H01L 27/3246 |
| 9,362,533 B2 * | 6/2016 | Choi | ................... | H01L 51/5246 |
| 9,614,015 B2 * | 4/2017 | Park | ........................ | G03F 7/004 |
| 9,620,570 B2 * | 4/2017 | Koo | ..................... | H01L 27/3258 |
| 10,008,555 B2 * | 6/2018 | Yoo | ..................... | H01L 27/3262 |
| 10,008,697 B2 * | 6/2018 | Jang | ..................... | H01L 27/3258 |
| 10,199,607 B2 * | 2/2019 | Kim | ..................... | H01L 51/5209 |
| 10,418,520 B2 * | 9/2019 | Kim | ...................... | H01L 51/00 |
| 10,622,586 B2 * | 4/2020 | Kang | ...................... | H01L 51/56 |
| 2010/0052519 A1 * | 3/2010 | Jeon | ..................... | H01L 27/3246 313/504 |
| 2012/0235175 A1 * | 9/2012 | Prushinskiy | ........ | H01L 51/5281 257/88 |

(Continued)

*Primary Examiner* — Ida M Soward
(74) *Attorney, Agent, or Firm* — Kinney & Lange, P.A.

(57) ABSTRACT

An OLED display panel includes: a substrate; a pixel defining layer disposed on the substrate and defining a pixel region and a non-pixel region outside the pixel region; a spacer layer disposed in the non-pixel region; and an organic light-emitting layer including: a first portion disposed in the pixel region, and a second portion disposed in the non-pixel region. A surface of at least one of the pixel defining layer or the spacer layer has a contact portion which is in contact with the organic light-emitting layer and which is rough.

19 Claims, 4 Drawing Sheets

(56) References Cited

U.S. PATENT DOCUMENTS

| | | | |
|---|---|---|---|
| 2012/0313123 A1* | 12/2012 | Kim | H01L 51/525 |
| | | | 257/89 |
| 2014/0027720 A1* | 1/2014 | Kim | H01L 51/00 |
| | | | 257/40 |
| 2015/0102292 A1* | 4/2015 | Kim | H01L 51/5246 |
| | | | 257/40 |
| 2015/0200237 A1* | 7/2015 | Yim | G02F 1/13394 |
| | | | 257/40 |
| 2015/0295014 A1* | 10/2015 | Lee | H01L 27/3246 |
| | | | 257/40 |
| 2018/0151842 A1* | 5/2018 | Park | H01L 51/5275 |
| 2018/0190932 A1* | 7/2018 | Koo | H01L 51/5209 |
| 2018/0197929 A1* | 7/2018 | Cho | H01L 27/3258 |
| 2019/0165318 A1* | 5/2019 | Choi | H01L 51/5268 |
| 2019/0363267 A1* | 11/2019 | Tanaka | G09F 9/30 |
| 2020/0117306 A1* | 4/2020 | Seong | H01L 27/323 |

* cited by examiner

OLED DISPLAY PANEL HAVING A ROUGHENED SURFACE, DISPLAY APPARATUS AND METHOD OF MANUFACTURING OLED DISPLAY PANEL

CROSS-REFERENCE TO RELATED APPLICATION

This application claims the benefit of Chinese Patent Application No. 201821518549.X, filed with the State Intellectual Property Office of China on Sep. 14, 2018, the whole disclosure of which is incorporated herein by reference.

TECHNICAL FIELD

Embodiments of the present disclosure relate to an OLED display panel, a display apparatus having the OLED display panel, and a method of manufacturing an OLED display panel.

BACKGROUND

A light emitting layer of an organic light-emitting diode (OLED) display panel is generally formed by a vapor deposition process. A vapor-deposited material and another layer are bonded by a Van der Waals force.

SUMMARY

Embodiments of the present disclosure provide an OLED display panel comprising: a substrate; a pixel defining layer disposed on the substrate and defining a pixel region and a non-pixel region outside the pixel region; a spacer layer disposed in the non-pixel region defined by the pixel defining layer; and an organic light-emitting layer comprising: a first portion disposed in the pixel region defined by the pixel defining layer, and a second portion disposed in the non-pixel region defined by the pixel defining layer, wherein a surface of at least one of the pixel defining layer and the spacer layer has a contact portion which is in contact with the organic light-emitting layer and which is rough.

According to embodiments of the present disclosure, the contact portion of the surface of the at least one of the pixel defining layer and the spacer layer has a rough structure, and the rough structure comprises a plurality of recesses, and protrusions between adjacent ones of the plurality of recesses.

According to embodiments of the present disclosure, a surface of the pixel defining layer has a contact portion which is in contact with the organic light-emitting layer and which has the rough structure.

According to embodiments of the present disclosure, the surface of the pixel defining layer has a portion which is in contact with the spacer layer and which has the rough structure, or the surface of the pixel defining layer has the rough structure, or the surface of the pixel defining layer has the rough structure and the spacer layer is disposed on a portion, between adjacent ones of the plurality of recesses, of the surface of the pixel defining layer.

According to embodiments of the present disclosure, the recesses of the rough structure comprise at least a first recess and a second recess, and a portion of the pixel defining layer corresponding to the first recess has a lesser thickness than a portion of the pixel defining layer corresponding to the second recess.

According to embodiments of the present disclosure, the thickness of the portion of the pixel defining layer corresponding to the first recess is zero, and the thickness of the portion of the pixel defining layer corresponding to the second recess is 0.5-1 μm.

According to embodiments of the present disclosure, a thickness of a portion, between adjacent ones of the plurality of recesses, of the pixel defining layer is greater than or equal to 1.5-2 times the thickness of the portion of the pixel defining layer corresponding to the second recess.

According to embodiments of the present disclosure, a sum of a thickness of the pixel defining layer and a thickness of the spacer layer is 1.5-3 times as large as the thickness of the pixel defining layer.

According to embodiments of the present disclosure, a surface of the spacer layer has a contact portion which is in contact with the organic light-emitting layer and which has the rough structure, and in a thickness direction of the spacer layer, a bottom of the recess of the rough structure is between two opposite surfaces of the spacer layer respectively facing away from and towards the pixel defining layer.

According to embodiments of the present disclosure, the rough structure comprises a rough substructure disposed between two adjacent sub-pixel units of at least one pixel unit.

According to embodiments of the present disclosure, the rough structure comprises at least one column of the recesses sequentially arranged in a direction perpendicular to a direction in which sub-pixel units of one of the pixel units are arranged.

According to embodiments of the present disclosure, the contact portion, which is in contact with the organic light-emitting layer and which has the rough structure, of the surface of the at least one of the pixel defining layer and the spacer layer comprises a first contact portion which is in contact with the first portion of the organic light-emitting layer and which has the rough structure.

According to embodiments of the present disclosure, the contact portion of the surface of the at least one of the pixel defining layer and the spacer layer comprises a second contact portion which is in contact with the second portion of the organic light-emitting layer and which has the rough structure.

According to embodiments of the present disclosure, the contact portion of the surface of the at least one of the pixel defining layer and the spacer layer comprises a first contact portion and a second contact portion which are in contact with the first portion and the second portion of the organic light-emitting layer, respectively, and each of which has the rough structure.

According to embodiments of the present disclosure, the pixel defining layer defines a plurality of the pixel regions, and the contact portion of the surface of the at least one of the pixel defining layer and the spacer layer comprises a portion which is between adjacent ones of the plurality of pixel regions and which has the rough structure.

According to embodiments of the present disclosure, the contact portion of the surface of the at least one of the pixel defining layer and the spacer layer comprises a portion which is in the pixel region and which has the rough structure.

According to embodiments of the present disclosure, the rough structure of the portion in the pixel region comprises a stepped rough structure.

According to embodiments of the present disclosure, the pixel defining layer defines a plurality of the pixel regions, and an orthogonal projection of each of the plurality of recesses on the substrate is smaller than both an orthogonal projection of each of the plurality of pixel regions on the substrate and an orthogonal projection of a portion, between two adjacent ones of the plurality of pixel regions, of the pixel defining layer on the substrate, or two or more of the plurality of recesses are disposed between two adjacent ones of the plurality of pixel regions.

Embodiments of the present disclosure further provide an OLED display apparatus comprising the above OLED display panel.

Embodiments of the present disclosure further provide a method of manufacturing an OLED display panel, the method comprising: forming, on a substrate, a pixel defining layer defining a pixel region and a non-pixel region outside the pixel region; forming a spacer layer in the non-pixel region defined by the pixel defining layer; and forming an organic light-emitting layer, the organic light-emitting layer comprising: a first portion disposed in the pixel region defined by the pixel defining layer, and a second portion disposed in the non-pixel region defined by the pixel defining layer, wherein a surface of at least one of the pixel defining layer and the spacer layer has a contact portion which is in contact with the organic light-emitting layer and which has a rough structure, and the rough structure comprises a plurality of recesses and protrusions between adjacent ones of the plurality of recesses.

BRIEF DESCRIPTION OF THE DRAWINGS

In order to describe embodiments of the present disclosure or technical solutions in the prior art more clearly, accompanying drawings required for describing the embodiments or the prior art will be simply explained as below. Apparently, the accompanying drawings for the following description are only some embodiments of the present disclosure. Those skilled in the art also could derive other accompanying drawings from these accompanying drawings without making a creative work.

DETAILED DESCRIPTION

A clear and complete description of technical solutions in embodiments of the present disclosure will be made as below in conjunction with the accompanying drawings in the embodiments of the present disclosure. Apparently, the described embodiments are some of the embodiments of the present disclosure rather than all of the embodiments of the present disclosure. All other embodiments derived by those skilled in the art based on the embodiments of the present disclosure without making a creative work shall fall within the protection scope of the present disclosure.

In the description of the present disclosure, it should be appreciated that orientations or positional relationships indicated by terms such as "upper", "lower", and "bottom" are based on orientations or positional relationships shown in the accompanying drawings, are merely used for convenience of the description of the present disclosure and simplification of the description, but do not indicate or imply that a device or an element of which an orientation or positional relationship is indicated must have the particular orientation and must be configured and operated in the particular orientation. Therefore, the orientations or positional relationships should not be construed to limit the present disclosure. In the description of the present disclosure, "a plurality of" means two or more unless otherwise described.

Figure 1:
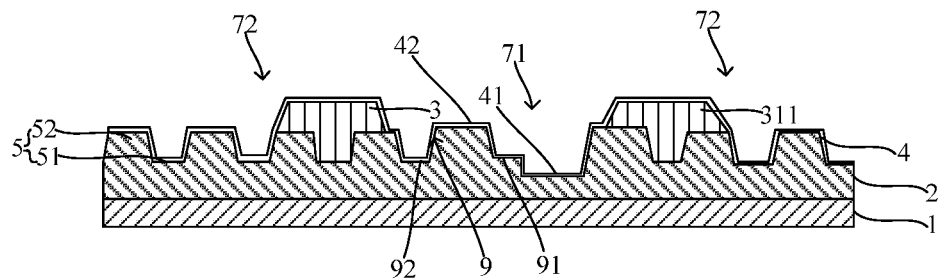
FIG. 1 is a schematic view showing a structure of an OLED display panel according to an embodiment of the present disclosure.
Figure 2:
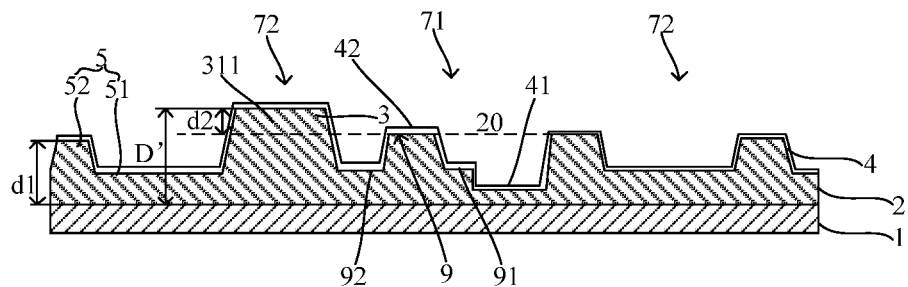
FIG. 2 is a schematic view showing a structure of an OLED display panel according to another embodiment of the present disclosure.
Figure 9:
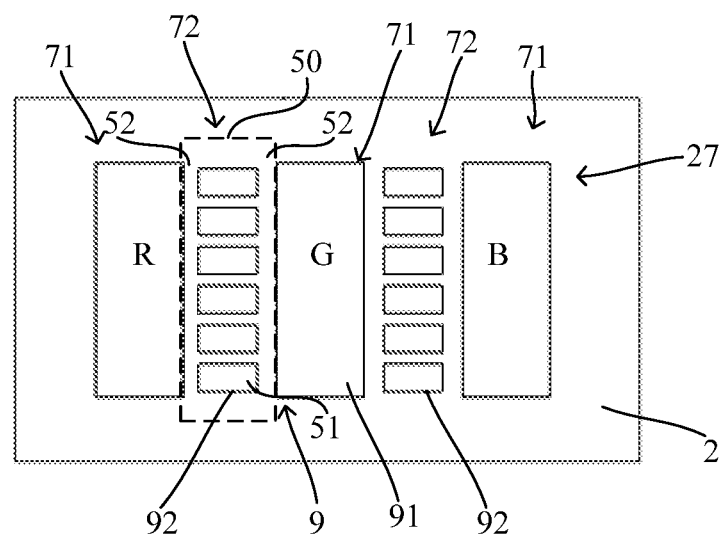
FIG. 9 is a schematic view showing a structure of an OLED display panel in which a column of recesses are disposed between sub-pixel units, according to an embodiment of the present disclosure.
Figure 10:
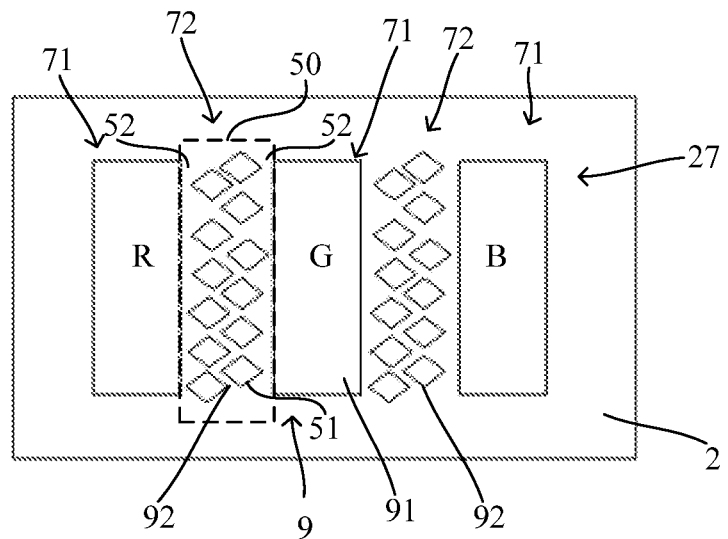
FIG. 10 is a schematic view showing a structure of an OLED display panel in which a plurality of columns of recesses are disposed between the sub-pixel units, according to another embodiment of the present disclosure.

Embodiments of the present disclosure provide an OLED display panel. Referring to FIGS. 1 and 2, the OLED display panel includes: a substrate 1; a pixel defining layer 2 disposed on the substrate 1 and defining a pixel region 71 and a non-pixel region 72 outside the pixel region 71; a spacer layer 3 disposed in the non-pixel region defined by the pixel defining layer 2; and an organic light-emitting layer 4. The organic light-emitting layer 4 includes a first portion 41 disposed in the pixel region defined by the pixel defining layer 2 and a second portion 42 disposed in the non-pixel region defined by the pixel defining layer (for example, the second portion extends from the first portion onto the spacer layer 3 and the pixel defining layer 2). A surface of at least one of the pixel defining layer 2 and the spacer layer 3 has a contact portion 9 which is in contact with the organic light-emitting layer 4 and which is rough. For example, each pixel region 71 corresponds to a single sub-pixel unit R, G, or B of a pixel unit 27, as shown in FIGS. 9 and 10.

The embodiments of the present disclosure provide an OLED display panel. The contact portion of the surface of the at least one of the pixel defining layer 2 and the spacer layer 3 is rough, or is a rough surface, and the organic light-emitting layer includes the first portion disposed in the pixel region defined by the pixel defining layer and the second portion extending from the first portion onto the at least one of the spacer layer and the pixel defining layer, thereby increasing a contact area between the organic light-emitting layer 4 and the pixel defining layer 2 and/or between the organic light-emitting layer 4 and the spacer layer 3, and thus increasing an adhesive force between the organic light-emitting layer 4 and the substrate 1 and avoiding a separation of films from one another at the time of folding or bending.

In embodiments of the present disclosure, the rough surface may be obtained by providing a flat surface with a plurality of protrusions, and recesses formed between the protrusions. The rough surface may also be obtained by providing a flat surface with a plurality of recesses, and protrusions between the recesses.

In an embodiment of the present disclosure, the contact portion of the surface of the at least one of the pixel defining layer 2 and the spacer layer 3 has a rough structure 5, and the rough structure 5 includes a plurality of recesses 51 and protrusions 52 between adjacent ones of the plurality of recesses 51. In embodiments of the present disclosure, the plurality of recesses 51 may be formed on the pixel defining layer 2 and/or the spacer layer 3 by exposing and etching.

Generally, the pixel defining layer 2 is disposed between adjacent ones of the sub-pixel units. In embodiments of the present disclosure, the surface of the pixel defining layer 2 has the rough structure 5. For example, at least a portion of the surface of the pixel defining layer 2 has the rough structure 5. According to an example of the present disclosure, a portion, between any two adjacent sub-pixel units, of the surface of the pixel defining layer 2 may have the rough structure 5, and the rest of the surface of the pixel defining layer 2 is a flat surface. The spacer layer 3 may include a single spacer 311 or a plurality of spacers 311 arranged at intervals. Therefore, in embodiments where the surface of the spacer layer 3 has the rough structure 5, only a single spacer 311 has the rough structure 5, or each of the plurality of spacers 311 has the rough structure 5, or some of the plurality of spacers 311 have the rough structure 5.

In embodiments of the present disclosure, the recesses 51 may have the same depth or different depths, and the rough structure 5 of the pixel defining layer 2 and the rough structure 5 of the spacer layer 3 may have the same shape or different shapes.

In the embodiment of the present disclosure, the shapes of the recesses 51 are not particularly limited. A section of the recess 51 along a depth direction may have a rectangular shape, a trapezoidal shape, a circular shape, a triangular shape, or a stepped shape. In the embodiments of the present disclosure, the stepped shape is shown by the reference numeral 511 in FIG. 3.

In embodiments of the present disclosure, referring to FIGS. 1 and 2, a surface of the pixel defining layer 2 has a contact portion which is in contact with the organic light-emitting layer 4 and which has the rough structure 5, and a surface of the spacer layer 3 in contact with the organic light-emitting layer 4 does not have the rough structure 5.

In an embodiment of the present disclosure, referring to FIG. 1, the surface of the pixel defining layer 2 also has a portion which is in contact with the spacer layer 3 and which has the rough structure 5. In other words, at least one spacer 311 of the spacer layer 3 continuously covers the surface of the pixel defining layer 2 in a region corresponding to one or more recesses 51 and one or more protrusions 52. In this way, a contact area between the pixel defining layer 2 and the spacer layer 3 is increased, and thus an adhesion force between films of the OLED display panel can be further increased, and a separation of the films from one another at the time of folding or bending is avoided.

In another embodiment of the present disclosure, referring to FIG. 2, the surface of the pixel defining layer 2 has the rough structure 5 and the spacer 311 of the spacer layer 3 is disposed on a portion, between adjacent ones of the plurality of recesses 51, of the surface of the pixel defining layer 2.

In the present embodiment, when a film is formed, a thickness D' of the formed film may be set to be 1.5-3 times as large as the thickness d1 of the pixel defining layer 2. The recesses 51, the protrusions 52, and a portion over the protrusion 52 (the portion over the dashed line 20 in FIG. 2), i.e. the spacer layer 3, are formed by exposing and etching. In this case, a sum of the thickness d1 of the pixel defining layer 2 and a thickness d2 of the spacer layer 3 is 1.5-3 times as large as the thickness d1 of the pixel defining layer 2.

Figure 3:
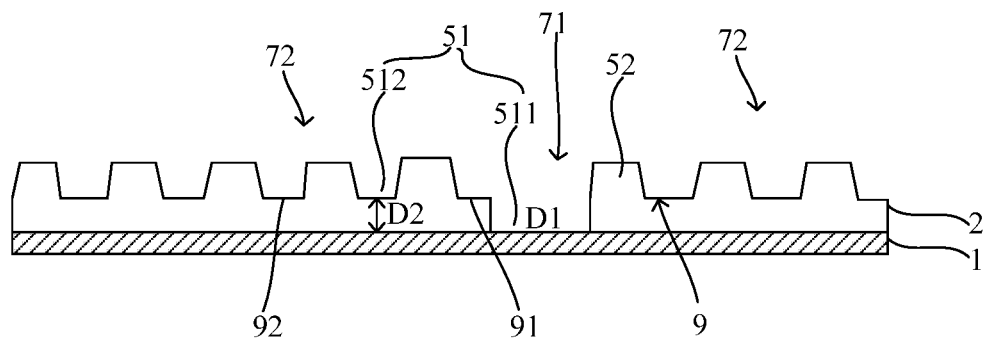
FIG. 3 is a schematic view showing a structure of an OLED display panel according to still another embodiment of the present disclosure.
Figure 4:
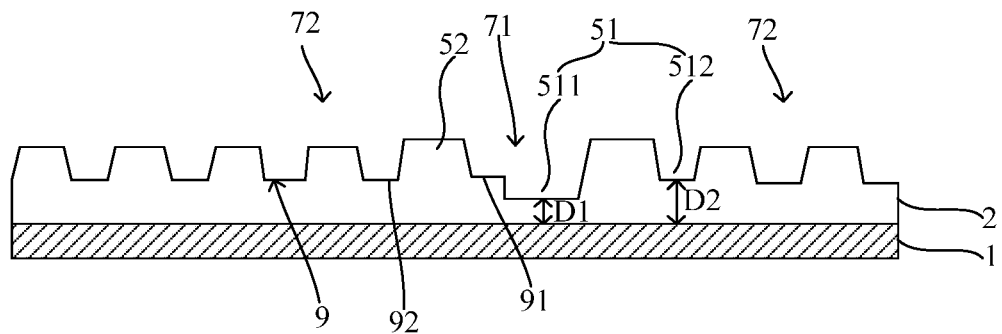
FIG. 4 is a schematic view showing a structure of an OLED display panel according to yet another embodiment of the present disclosure.

In still another embodiment of the present disclosure, referring to FIGS. 3 and 4, the recesses 51 of the rough structure 5 include at least a first recess 511 and a second recess 512, and a thickness D1 of a portion of the pixel defining layer 2 corresponding to the first recess 511 is less than a thickness D2 of a portion of the pixel defining layer 2 corresponding to the second recess 512.

In the embodiments of the present disclosure, the thickness of the portion of the pixel defining layer 2 corresponding to the first recess 511 and the thickness of the portion of the pixel defining layer 2 corresponding to the second recess 512 are not particularly limited.

In embodiments of the present disclosure, as shown in FIG. 3, a section of the first recess 511 along a depth direction has a stepped shape, and the thickness of the portion of the pixel defining layer 2 corresponding to the first recess 511 is D1. A thickness of the pixel defining layer 2 before the rough structure 5 is formed is equal to a distance between a horizontal plane passing through a lowermost point of the first recess 511 and a horizontal plane passing through an uppermost point of the protrusion 52.

In an embodiment of the present disclosure, the thickness D1 of the portion of the pixel defining layer 2 corresponding to the first recess 511 is zero, and the thickness D2 of the portion of the pixel defining layer 2 corresponding to the second recess 512 is 0.5-1 μm.

In embodiments of the present disclosure, the rough structure 5 may be formed by means of the half-tone mask.

Figure 5:
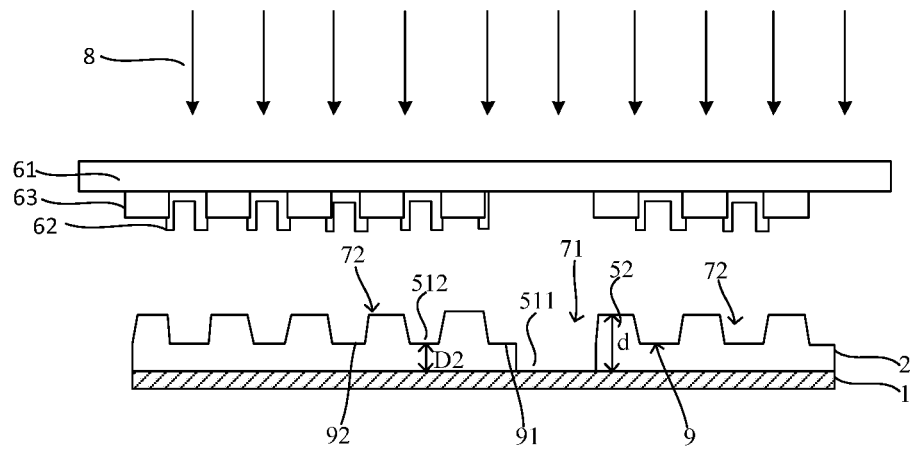
FIG. 5 is a schematic view showing a structure of an OLED display panel in which a pixel defining layer has a rough structure, according to an embodiment of the present disclosure.

As shown in FIG. 5, the half-tone mask may include a transparent portion 61, a partially transparent portion 62, and an opaque portion 63. The pixel defining layer 2 is exposed by an incident light 8 by using the half-tone mask, and then the exposed pixel defining layer 2 is etched. A portion of the pixel defining layer 2 corresponding to the transparent portion 61 is removed to form the first recess 511, a portion of the pixel defining layer 2 corresponding to the partially transparent portion 62 is formed with the second recess 512, and a portion of the pixel defining layer 2 corresponding to the opaque portion 63 is formed with the protrusion 52.

In embodiments of the present disclosure, referring to FIG. 5, a thickness d of a portion, between adjacent ones of the plurality of recesses 51, of the pixel defining layer 2 is greater than or equal to 1.5-2 times the thickness D2 of the portion of the pixel defining layer 2 corresponding to the second recess 512.

Figure 6:
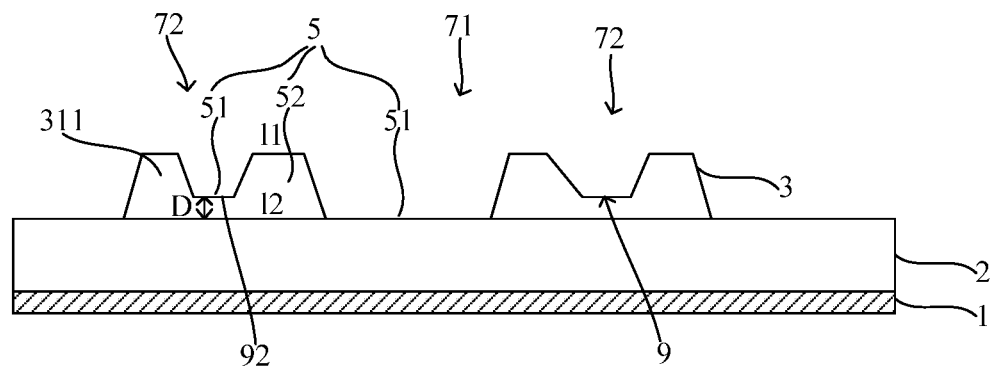
FIG. 6 is a schematic view showing a structure of an OLED display panel in which a spacer layer has the rough structure, according to an embodiment of the present disclosure.

In embodiments of the present disclosure, referring to FIG. 6, the surface of the pixel defining layer 2 in contact with the organic light-emitting layer 4 does not have the rough structure 5, and the surface of the spacer layer 3 in contact with the organic light-emitting layer 4 has the rough structure 5.

In this case, a thickness D of a portion of the spacer layer 3 corresponding to the recess 51 of the rough structure 5 is equal to a distance between two opposite surfaces 11 and 12, respectively facing away from and towards the pixel defining layer 2, of the portion of the spacer layer 3, and in a thickness direction of the spacer layer 3, a bottom of the recess 51 of the rough structure 5 is between two opposite surfaces 11 and 12 of the spacer layer 3 respectively facing away from and towards the pixel defining layer 2, as shown in FIG. 6.

Figure 7:
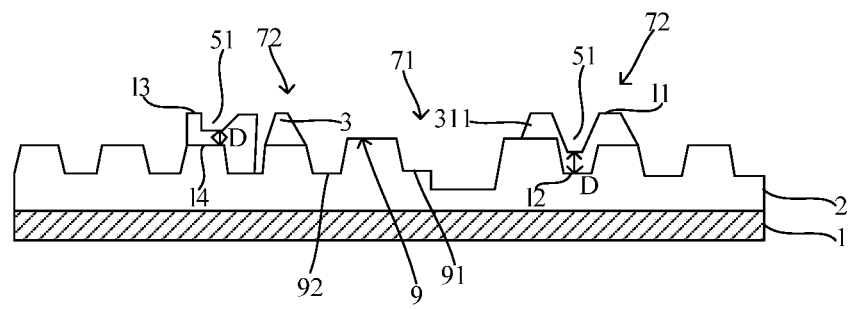
FIG. 7 is a schematic view showing a structure of an OLED display panel in which each of the pixel defining layer and the spacer layer has the rough structure, according to an embodiment of the present disclosure.
Figure 8:
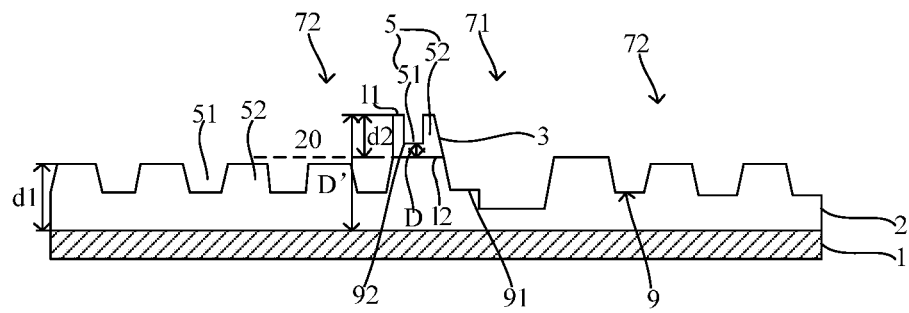
FIG. 8 is a schematic view showing a structure of an OLED display panel in which each of the pixel defining layer and the spacer layer has the rough structure, according to another embodiment of the present disclosure.

In embodiments of the present disclosure, referring to FIGS. 7 and 8, both the surface of the pixel defining layer 2 in contact with the organic light-emitting layer 4, and the surface of the spacer layer 3 in contact with the organic light-emitting layer 4 have the rough structure 5.

In an embodiment of the present disclosure, referring to FIG. 7, the surface of the pixel defining layer 2 also has a portion which is in contact with the spacer layer 3 and which has the rough structure 5. In other words, at least one spacer 311 of the spacer layer 3 continuously covers the surface of the pixel defining layer 2 in a region corresponding to one or more recesses 51 and one or more protrusions 52. In this way, the contact area between the pixel defining layer 2 and the spacer layer 3 is increased, and thus an adhesion force between the pixel defining layer 2 and the spacer layer 3 can be increased, and an adhesion force between the organic light-emitting layer and the pixel defining layer 2 and spacer layer 3 can be further increased.

In the present embodiment, the thickness D of a portion of the spacer layer 3 corresponding to the recess 51 of the rough structure 5 of the surface of the spacer layer 3 is equal to a distance between upper and lower surfaces of the portion of the spacer layer 3. The upper and lower surfaces 11 and 12 of the spacer layer 3 vary depending on a position of the spacer 311 of the spacer layer 3. In the case where the spacer 311 of the spacer layer 3 is disposed on the surface of the pixel defining layer 2 in a region corresponding to the recess 51 of the pixel defining layer 2, the upper surface 11 of the spacer layer 3 is a horizontal plane passing through an uppermost point of the protrusion 52 of the spacer layer 3, and the lower surface 12 of the spacer layer 3 is a horizontal plane passing through a bottom surface of the recess 51 of the pixel defining layer 2, as shown in FIG. 7. In the case where the spacer 311 of the spacer layer 3 is disposed on the surface of the pixel defining layer 2 between two adjacent recesses 51 of the pixel defining layer 2, the upper surface 13 of the spacer layer 3 is the horizontal plane passing through the uppermost point of the protrusion 52 of the spacer layer 3, and the lower surface 14 of the spacer layer 3 is a horizontal plane passing through an uppermost point of the protrusion 52 of the pixel defining layer 2, as shown in FIG. 7.

In another embodiment of the present disclosure, referring to FIG. 8, the spacer 311 of the spacer layer 3 is disposed on the surface of the pixel defining layer 2 between adjacent recesses 51 of the pixel defining layer 2.

In the present embodiment, when a film is formed, a thickness D' of the formed film may be set to be 1.5-3 times as large as the thickness d1 of the pixel defining layer 2. The recesses 51, the protrusions 52, and a portion over the protrusion 52 (the portion over the dashed line 20 in FIG. 8) are formed by exposing and etching, and the spacer layer 3 of which the surface has the rough structure 5 is formed by exposing and etching the portion over the protrusion 52. In this case, a sum of the thickness d1 of the pixel defining layer 2 and a thickness d2 of the spacer layer 3 is 1.5-3 times as large as the thickness d1 of the pixel defining layer 2.

In the present embodiment, the thickness of a portion of the spacer layer 3 corresponding to the recess 51 of the rough structure 5 of the surface of the spacer layer 3 is D. Before the rough structure 5 is formed, the spacer layer 3 has two opposite surfaces 11 and 12 respectively facing away from and towards the pixel defining layer 2, as shown in FIG. 8. In this way, the thickness D of the portion of the spacer layer 3 corresponding to the recess 51 of the rough structure 5 of the surface of the spacer layer 3 depends on a thickness of the portion over the protrusion 52 of the pixel defining layer 2 (i.e. the portion over the dashed line 20 in FIG. 8).

In embodiments of the present disclosure, both the pixel defining layer 2 and the spacer layer 3 are disposed between adjacent sub-pixel units of the pixel unit. For example, the pixel defining layer 2 for defining pixels is disposed between adjacent sub-pixel units of the pixel unit, and the spacers 311 of the spacer layer 3 may be distributed at intervals of one or more pixel units.

In embodiments of the present disclosure, the rough structure 5 of the pixel defining layer 2 and/or the rough structure 5 of the spacer layer 3 may be disposed in a plurality of regions of the OLED display panel which are arranged at intervals (i.e. the rough structure is disposed in a region between two adjacent sub-pixel units defined by the pixel defining layer 2 and no rough structure is disposed in the remaining region of the OLED display panel in which a flat surface is provided), or the rough structure 5 of the pixel defining layer 2 and/or the rough structure 5 of the spacer layer 3 may also be disposed in a continuous region of the OLED display panel (i.e. the surface, in contact with the organic light-emitting layer 4, of at least one of the pixel defining layer 2 and the spacer layer 3 has a continuous rough structure).

In an embodiment of the present disclosure, referring to FIGS. 9 and 10, the rough structure 5 includes a rough substructure 50 disposed between two adjacent ones of sub-pixel units R, G and B of at least one of pixel units.

In embodiments of the present disclosure, the rough substructure 50 may be disposed between the sub-pixel units R and G of the pixel unit, the rough substructure 50 may also be disposed between the sub-pixel units G and B of the pixel unit, or the rough substructure 50 may also be disposed among the sub-pixel units R, G and B of the pixel unit.

In embodiments of the present disclosure, referring to FIGS. 9 and 10, the rough substructure 50 includes at least one column of the recesses 51 located between two adjacent sub-pixel units and sequentially arranged in a direction perpendicular to a direction in which the sub-pixel units R, G and B of one of the pixel units are arranged (FIG. 9 shows one column of recesses 51 while FIG. 10 shows two columns of recesses 51). The protrusions 52 are disposed among the recesses 51 and between the sub-pixel units adjacent to the recesses 51.

Figure 11:
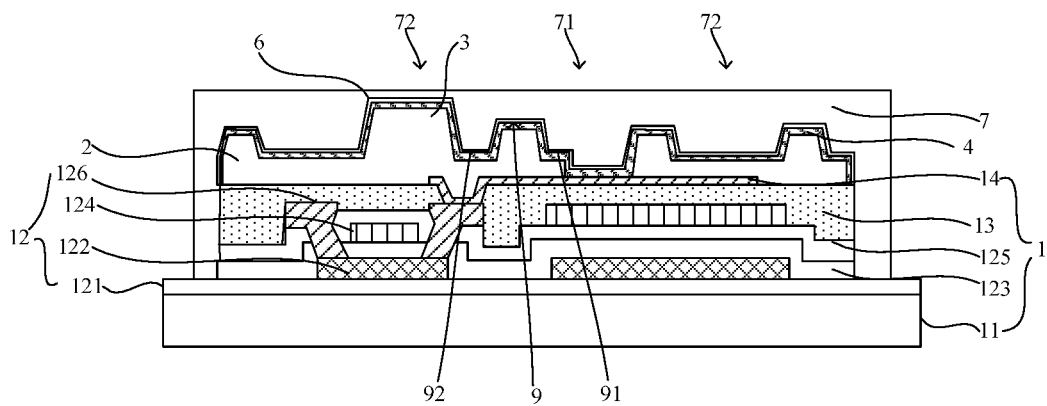
FIG. 11 is a schematic view showing a structure of an OLED display panel according to an embodiment of the present disclosure.

Referring to FIGS. 1 and 11, in some embodiments of the present disclosure, the contact portion 9, which is in contact with the organic light-emitting layer 4 and which has the rough structure 5, of the surface of the at least one of the pixel defining layer 2 and the spacer layer 3 includes a first contact portion 91 which is in contact with the first portion 41 of the organic light-emitting layer 4 and which has the rough structure 5.

Referring to FIGS. 1 and 11, in some embodiments of the present disclosure, the contact portion 9, which is in contact with the organic light-emitting layer 4 and which has the rough structure 5, of the surface of the at least one of the pixel defining layer 2 and the spacer layer 3 includes a second contact portion 92 which is in contact with the second portion 42 of the organic light-emitting layer 4 and which has the rough structure 5.

Referring to FIGS. 1 and 11, in some embodiments of the present disclosure, the contact portion, which is in contact with the organic light-emitting layer 4 and which has the rough structure 5, of the surface of the at least one of the pixel defining layer 2 and the spacer layer 3 includes a first contact portion and a second contact portion which are in contact with the first portion and the second portion of the organic light-emitting layer 4, respectively, and each of which has the rough structure 5.

Referring to FIGS. 1, 9, 10 and 11, in some embodiments of the present disclosure, the pixel defining layer 2 defines a plurality of the pixel regions 71 (FIGS. 9 and 10 each show three pixel regions 71), and the contact portion, which is in contact with the organic light-emitting layer 4 and which has the rough structure 5, of the surface of the at least one of the pixel defining layer 2 and the spacer layer 3 includes a portion which is between adjacent ones of the plurality of pixel regions and which has the rough structure 5.

Referring to FIGS. 1, 4, 9, 10 and 11, in some embodiments of the present disclosure, the contact portion, which is in contact with the organic light-emitting layer 4 and which has the rough structure 5, of the surface of the at least one of the pixel defining layer 2 and the spacer layer 3 includes a portion which is in the pixel region and which has the rough structure 5. For example, the rough structure 5 of the portion in the pixel region includes a stepped rough structure 5.

Referring to FIGS. 1, 4, 9, 10 and 11, in some embodiments of the present disclosure, the pixel defining layer 2 defines a plurality of the pixel regions, and an orthogonal projection of each of the plurality of recesses 51 on the substrate 1 is smaller than both an orthogonal projection of each of the plurality of pixel regions on the substrate 1 and an orthogonal projection of a portion, between two adjacent ones of the plurality of pixel regions, of the pixel defining layer 2 on the substrate 1. For example, the pixel defining layer 2 defines a plurality of the pixel regions, and two or more of the plurality of recesses 51 are disposed between two adjacent ones of the plurality of pixel regions.

In an embodiment of the present disclosure, referring to FIG. 11, the substrate 1 may include: a flexible base substrate 11, and an array of thin film transistors 12, a planarization layer 13 and an anode 14, which are disposed on the flexible base substrate 11.

A flexible OLED display panel can be obtained by using the flexible base substrate 11.

Specifically, a buffer layer 121 may be formed on the flexible base substrate 11, an active layer 122 is formed on the buffer layer 121, and an interlayer insulating layer 123 is formed on the active layer 122. Then, a gate electrode 124 and a gate insulating layer 125 are sequentially formed, and a source electrode 126 and a drain electrode 126 are formed on the gate insulating layer 125. The active layer 122 is insulated from the gate electrode 124 by means of the interlayer insulating layer 123. The source electrode 126 is electrically connected to the active layer 122 through a first via hole formed in the interlayer insulating layer 123 and the gate insulating layer 125. The array of thin film transistors 12 is configured to control the pixel units.

The planarization layer 13 is formed on the array of thin film transistors 12. The anode 14 is electrically connected to the array of thin film transistors 12 through a second via hole formed in the planarization layer 13.

In embodiments of the present disclosure, referring to FIG. 11, the OLED display panel may further include: a metal electrode layer 6 formed on the organic light-emitting layer 4 and serving as a cathode of the OLED, and a packaging layer 7 formed on the metal electrode layer 6.

Embodiments of the present disclosure further provide an OLED display apparatus including the OLED display panel according to any one of the above embodiments.

The embodiments of the present disclosure provide an OLED display apparatus. The surface, in contact with the organic light-emitting layer, of at least one of the pixel defining layer and the spacer layer of the OLED display panel has the rough structure, thereby increasing a contact area between the organic light-emitting layer and the pixel defining layer and/or between the organic light-emitting layer and the spacer layer, and thus an adhesive force between the organic light-emitting layer and the substrate and avoiding a separation of films from one another at the time of folding or bending.

Embodiments of the present disclosure further provide a method of manufacturing an OLED display panel. The method includes: forming, on a substrate, a pixel defining layer defining a pixel region and a non-pixel region outside the pixel region; forming a spacer layer in the non-pixel region defined by the pixel defining layer; and forming an organic light-emitting layer. The organic light-emitting layer includes: a first portion disposed in the pixel region defined by the pixel defining layer, and a second portion disposed in the non-pixel region defined by the pixel defining layer. A surface of at least one of the pixel defining layer and the spacer layer has a contact portion which is in contact with the organic light-emitting layer and which has a rough structure, and the rough structure includes a plurality of recesses, and protrusions between adjacent ones of the plurality of recesses.

The embodiments of the present disclosure provide a method of manufacturing an OLED display panel. The surface, in contact with the organic light-emitting layer, of at least one of the pixel defining layer and the spacer layer of the OLED display panel has the rough structure, thereby increasing a contact area between the organic light-emitting layer and the pixel defining layer and/or between the organic light-emitting layer and the spacer layer, and thus an adhesive force between the organic light-emitting layer and the substrate and avoiding a separation of films from one another at the time of folding or bending.

As described above, the embodiments of the present disclosure provide an OLED display panel, a display apparatus having the OLED display panel, and a method of manufacturing an OLED display panel, thereby increasing a contact area between the organic light-emitting layer and the substrate, and thus effectively increasing an adhesion force between the organic light-emitting layer and the substrate and avoiding a separation of films from one another at the time of folding or bending.

Although some exemplary embodiments of the present disclosure have been shown and described above, it would be appreciated by a person skilled in the art that many modifications or changes may be made therein without departing from the principle and spirit of the present disclosure, the scope of which is defined in the appended claims and their equivalents.

What is claimed is:

1. An OLED display panel comprising:
   a substrate;
   a pixel defining layer disposed on the substrate and defining a pixel region and a non-pixel region outside the pixel region;
   a spacer layer disposed in the non-pixel region defined by the pixel defining layer; and
   an organic light-emitting layer comprising: a first portion disposed in the pixel region defined by the pixel defining layer, and a second portion disposed in the non-pixel region defined by the pixel defining layer, wherein a surface of at least one of the pixel defining layer or the spacer layer has a contact portion which is in contact with the organic light-emitting layer and which is rough, wherein the contact portion of the surface of the at least one of the pixel defining layer or the spacer layer has a rough structure, and the rough structure comprises a plurality of recesses, and protrusions between adjacent ones of the plurality of recesses, and wherein the contact portion of the surface of the at least one of the pixel defining layer and the spacer layer comprises a contact portion which is in contact with the second portion of the organic light-emitting layer and which has the rough structure.

2. The OLED display panel as claimed in claim 1, wherein:
a surface of the pixel defining layer has a contact portion which is in contact with the organic light-emitting layer and which has the rough structure.

3. The OLED display panel as claimed in claim 2, wherein:
the surface of the pixel defining layer has a portion which is in contact with the spacer layer and which has the rough structure, or the surface of the pixel defining layer has the rough structure, and
the spacer layer is disposed on a portion, between adjacent ones of the plurality of recesses, of the surface of the pixel defining layer.

4. The OLED display panel as claimed in claim 2, wherein:
a sum of a thickness of the pixel defining layer and a thickness of the spacer layer is 1.5-3 times as large as the thickness of the pixel defining layer.

5. The OLED display panel as claimed in claim 1, wherein:
a surface of the spacer layer has a contact portion which is in contact with the organic light-emitting layer and which has the rough structure, and
in a thickness direction of the spacer layer, a bottom of the recess of the rough structure is between two opposite surfaces of the spacer layer respectively facing away from and towards the pixel defining layer.

6. The OLED display panel as claimed in claim 1, wherein:
the rough structure comprises a rough substructure disposed between two adjacent ones of sub-pixel units of at least one of pixel units.

7. The OLED display panel as claimed in claim 1, wherein:
the contact portion, which is in contact with the organic light-emitting layer and which has the rough structure, of the surface of the at least one of the pixel defining layer and the spacer layer further comprises another contact portion which is in contact with the first portion of the organic light-emitting layer and which has the rough structure.

8. The OLED display panel as claimed in claim 1, wherein:
the pixel defining layer defines a plurality of the pixel regions, and
the contact portion of the surface of the at least one of the pixel defining layer and the spacer layer comprises a portion which is between adjacent ones of the plurality of pixel regions and which has the rough structure.

9. The OLED display panel as claimed in claim 1, wherein:
the contact portion of the surface of the at least one of the pixel defining layer and the spacer layer comprises a portion which is in the pixel region and which has the rough structure.

10. The OLED display panel as claimed in claim 9, wherein:
the rough structure of the portion in the pixel region comprises a stepped rough structure.

11. The OLED display panel as claimed in claim 1, wherein:
the pixel defining layer defines a plurality of the pixel regions, and
an orthogonal projection of each of the plurality of recesses on the substrate is smaller than both an orthogonal projection of each of the plurality of pixel regions on the substrate and an orthogonal projection of a portion, between two adjacent ones of the plurality of pixel regions, of the pixel defining layer on the substrate, or two or more of the plurality of recesses are disposed between two adjacent ones of the plurality of pixel regions.

12. An OLED display apparatus comprising:
the OLED display panel as claimed in claim 1.

13. A method of manufacturing the OLED display panel of claim 1, the method comprising:
forming the pixel defining layer on the substrate;
forming the spacer layer in the non-pixel region; and
forming the organic light-emitting layer,
wherein the contact portion has a rough structure, and the rough structure comprises a plurality of recesses and protrusions between adjacent ones of the plurality of recesses.

14. An OLED display panel comprising:
a substrate;
a pixel defining layer disposed on the substrate and defining a pixel region and a non-pixel region outside the pixel region;
a spacer layer disposed in the non-pixel region defined by the pixel defining layer; and
an organic light-emitting layer comprising: a first portion disposed in the pixel region defined by the pixel defining layer, and a second portion disposed in the non-pixel region defined by the pixel defining layer,
wherein a surface of at least one of the pixel defining layer or the spacer layer has a contact portion which is in contact with the organic light-emitting layer and which is rough,
wherein the contact portion of the surface of the at least one of the pixel defining layer or the spacer layer has a rough structure, and the rough structure comprises a plurality of recesses, and protrusions between adjacent ones of the plurality of recesses,
wherein a surface of the pixel defining layer has a contact portion which is in contact with the organic light-emitting layer and which has the rough structure, and
wherein the recesses of the rough structure comprise at least a first recess and a second recess, and a portion of the pixel defining layer corresponding to the first recess has a lesser thickness than a portion of the pixel defining layer corresponding to the second recess.

15. The OLED display panel as claimed in claim 14, wherein:
the thickness of the portion of the pixel defining layer corresponding to the first recess is zero, and the thickness of the portion of the pixel defining layer corresponding to the second recess is 0.5-1 µm.

16. The OLED display panel as claimed in claim 14, wherein:
a thickness of a portion, between adjacent ones of the plurality of recesses, of the pixel defining layer is greater than or equal to 1.5-2 times the thickness of the portion of the pixel defining layer corresponding to the second recess.

17. A method of manufacturing the OLED display panel of claim 14, the method comprising:
forming the pixel defining layer on the substrate;
forming the spacer layer in the non-pixel region; and
forming the organic light-emitting layer,
wherein the contact portion has a rough structure, and the rough structure comprises a plurality of recesses and protrusions between adjacent ones of the plurality of recesses.

18. An OLED display panel comprising:
a substrate;
a pixel defining layer disposed on the substrate and defining a pixel region and a non-pixel region outside the pixel region;
a spacer layer disposed in the non-pixel region defined by the pixel defining layer; and
an organic light-emitting layer comprising: a first portion disposed in the pixel region defined by the pixel defining layer, and a second portion disposed in the non-pixel region defined by the pixel defining layer,
wherein a surface of at least one of the pixel defining layer or the spacer layer has a contact portion which is in contact with the organic light-emitting layer and which is rough,
wherein the contact portion of the surface of the at least one of the pixel defining layer or the spacer layer has a rough structure, and the rough structure comprises a plurality of recesses, and protrusions between adjacent ones of the plurality of recesses,
wherein a surface of the pixel defining layer has a contact portion which is in contact with the organic light-emitting layer and which has the rough structure,
wherein the rough structure comprises a rough substructure disposed between two adjacent ones of sub-pixel units of at least one of pixel units, and
wherein the rough substructure comprises at least one column of the recesses sequentially arranged in a direction perpendicular to a direction in which sub-pixel units of one of the pixel units are arranged.

19. A method of manufacturing the OLED display panel of claim 18, the method comprising:
forming the pixel defining layer on the substrate;
forming the spacer layer in the non-pixel region; and
forming the organic light-emitting layer,
wherein the contact portion has a rough structure, and the rough structure comprises a plurality of recesses and protrusions between adjacent ones of the plurality of recesses.

* * * * *